United States Patent
Grimaldi et al.

[11] Patent Number: 6,111,297
[45] Date of Patent: Aug. 29, 2000

[54] MOS-TECHNOLOGY POWER DEVICE INTEGRATED STRUCTURE AND MANUFACTURING PROCESS THEREOF

[75] Inventors: Antonio Grimaldi, Mascalucia; Antonino Schillaci, Messina, both of Italy

[73] Assignee: Consorzio per la Ricerca sulla Microelettronica nel Mezzogiorno, Catania, Italy

[21] Appl. No.: 09/085,931

[22] Filed: May 28, 1998

Related U.S. Application Data

[63] Continuation of application No. 08/605,381, Feb. 22, 1996, Pat. No. 5,798,554.

[30] Foreign Application Priority Data

Feb. 24, 1995 [EP] European Pat. Off. .............. 95830055
Dec. 22, 1995 [EP] European Pat. Off. .............. 95830535

[51] Int. Cl.[7] .................................................. H01L 29/72
[52] U.S. Cl. .......................... 257/401; 257/329; 257/341; 257/380; 257/384; 257/412; 438/156; 438/268; 438/514; 438/586; 438/647; 438/652; 438/694
[58] Field of Search .................................... 257/329, 341, 257/380, 384, 401, 412; 438/156, 268, 514, 586, 647, 652, 694

[56] References Cited

U.S. PATENT DOCUMENTS

| | | | |
|---|---|---|---|
| 4,015,278 | 3/1977 | Fukuta ..................................... | 257/277 |
| 4,055,884 | 11/1977 | Jambotkar ................................ | 29/571 |
| 4,072,975 | 2/1978 | Ishitani . | |
| 4,145,700 | 3/1979 | Jambotkar ................................ | 357/23 |
| 4,344,081 | 8/1982 | Pao et al. .................................. | 357/43 |
| 4,345,265 | 8/1982 | Blanchard ................................ | 357/23 |
| 4,376,286 | 3/1983 | Lidow . | |
| 4,399,449 | 8/1983 | Herman et al. ........................... | 357/53 |
| 4,412,242 | 10/1983 | Herman et al. ........................... | 357/52 |
| 4,414,560 | 11/1983 | Lidow ...................................... | 357/39 |
| 4,593,302 | 6/1986 | Lidow . | |
| 4,605,948 | 8/1986 | Martinelli .................................. | 357/34 |

(List continued on next page.)

FOREIGN PATENT DOCUMENTS

| | | | | |
|---|---|---|---|---|
| 1 123 119 | 5/1982 | Canada | ........................... | H01L 29/04 |
| 1 136 291 | 11/1982 | Canada | ........................... | H01L 29/94 |
| 0 119 400 | 9/1984 | European Pat. Off. | ........ | H01L 29/78 |

(List continued on next page.)

OTHER PUBLICATIONS

European Search Report from European Patent Application 95830055.0, filed Feb. 24, 1995.
Patent Abstracts of Japan, vol. 014 No. 387 (E–0967), Aug. 21, 1990 & JP–A–02 143566 (Toshiba Corp.) Jun. 1, 1990.
European Search Report from European Patent Application 95830535.1, filed Dec. 22, 1995.
Mena J., et al., "High Frequency Performance of VDMOS Power Transistors", International Electron Devices Meeting. Technical Digest, Washington, D.C., USA, Dec. 8–10, 1980, 1980 New York, NY, USA.

(List continued on next page.)

*Primary Examiner*—Edward Wojciechowicz
*Attorney, Agent, or Firm*—Wolf, Greenfield & Sacks, P.C.; James H. Morris; Theodore E. Galanthay

[57] ABSTRACT

A MOS-technology power device integrated structure includes a first plurality of elongated doped semiconductor stripes of a first conductivity type formed in a semiconductor layer of a second conductivity type, each including an elongated source region of the first conductivity type, an annular doped semiconductor region of the first conductivity type formed in the semiconductor layer and surrounding and merged with the elongated stripes, insulated gate stripes extending over the semiconductor layer between adjacent elongated stripes, a plurality of conductive gate fingers extending over and electrically connected to the insulated gate stripes, and a plurality of source metal fingers, each one extending over a respective elongated stripe and contacting the elongated stripe and the respective elongated source region, so that the source metal fingers and the conductive gate fingers are interdigitated.

49 Claims, 11 Drawing Sheets

U.S. PATENT DOCUMENTS

| | | | |
|---|---|---|---|
| 4,642,666 | 2/1987 | Lidow et al. | 357/23.4 |
| 4,680,853 | 7/1987 | Lidow . | |
| 4,705,759 | 11/1987 | Lidow et al. | 437/29 |
| 4,716,126 | 12/1987 | Cogan | 437/24 |
| 4,798,810 | 1/1989 | Blanchard et al. | 437/29 |
| 4,816,882 | 3/1989 | Blanchard et al. | 357/23.4 |
| 4,901,127 | 2/1990 | Chow et al. | 357/23.4 |
| 4,927,772 | 5/1990 | Arthur et al. | 437/6 |
| 4,931,408 | 6/1990 | Hshieh | 437/44 |
| 4,959,699 | 9/1990 | Lidow et al. | 257/328 |
| 4,963,972 | 10/1990 | Shinohe et al. | 357/38 |
| 4,974,059 | 11/1990 | Kinzer | 357/23.4 |
| 5,008,725 | 4/1991 | Lidow . | |
| 5,015,593 | 5/1991 | Yawata et al. | 437/25 |
| 5,031,009 | 7/1991 | Fujihira | 357/23.4 |
| 5,043,781 | 8/1991 | Nishiura et al. | 357/23.6 |
| 5,119,153 | 6/1992 | Korman et al. | 357/23.4 |
| 5,130,767 | 7/1992 | Lidow et al. | 357/23.4 |
| 5,160,985 | 11/1992 | Akiyama | 257/145 |
| 5,164,804 | 11/1992 | Terashima | 257/487 |
| 5,191,396 | 3/1993 | Lidow et al. | 257/339 |
| 5,208,471 | 5/1993 | Mori et al. | 257/327 |
| 5,286,984 | 2/1994 | Nakagawa et al. | 257/139 |
| 5,338,961 | 8/1994 | Lidow et al. | 257/342 |
| 5,382,538 | 1/1995 | Zambrano . | |
| 5,397,728 | 3/1995 | Sasaki et al. | 437/44 |
| 5,418,179 | 5/1995 | Hotta | 437/57 |
| 5,426,320 | 6/1995 | Zambrano | 257/328 |
| 5,442,216 | 8/1995 | Gough | 257/355 |
| 5,489,799 | 2/1996 | Zambrano . | |
| 5,508,217 | 4/1996 | Sawada | 437/40 |
| 5,563,436 | 10/1996 | Barret et al. | 257/328 |
| 5,621,234 | 4/1997 | Kato | 257/339 |
| 5,631,483 | 5/1997 | Ferla et al. | 257/341 |
| 5,670,392 | 9/1997 | Ferla et al. | 437/29 |
| 5,731,604 | 3/1998 | Kinzer | 257/153 |

FOREIGN PATENT DOCUMENTS

| | | | |
|---|---|---|---|
| 0 211 972 | 3/1987 | European Pat. Off. | H01L 29/78 |
| 0 237 932 | 9/1987 | European Pat. Off. | H01L 29/60 |
| 0 252 236 | 1/1988 | European Pat. Off. | H01L 29/78 |
| 0 279 403 | 8/1988 | European Pat. Off. | H01L 29/78 |
| 0 304 839 | 3/1989 | European Pat. Off. | H01L 21/28 |
| 0 358 389 | 3/1990 | European Pat. Off. | H01L 29/06 |
| 0 393 949 | 10/1990 | European Pat. Off. | H01L 29/78 |
| 0 405 138 | 1/1991 | European Pat. Off. | H01L 29/72 |
| 0 543 313 | 5/1993 | European Pat. Off. | H01L 29/78 |
| 0 632 503 | 1/1995 | European Pat. Off. | H01L 29/06 |
| 0 671 769 | 9/1995 | European Pat. Off. | H01L 29/78 |
| 0 685 886 | 12/1995 | European Pat. Off. | H01L 23/48 |
| 2 640 081 | 6/1990 | France | H01L 27/10 |
| 51-48981 | 4/1976 | Japan | H01L 29/78 |
| 51-85381 | 7/1976 | Japan | H01L 29/78 |
| 51-23088 | 9/1977 | Japan | H01L 29/78 |
| 52-65943 | 9/1977 | Japan | H01L 29/78 |
| 53-66181 | 6/1978 | Japan | H01L 29/78 |
| 53-74385 | 7/1978 | Japan | H01L 29/76 |
| 53-135284 | 11/1978 | Japan | H01L 29/78 |
| 2 087 648 | 5/1982 | United Kingdom | H01L 23/00 |
| WO 94 11904 | 5/1994 | WIPO | H01L 29/78 |

OTHER PUBLICATIONS

Patent Abstracts of Japan, vol. 014, No. 387 (E–0967), Aug. 21, 1990 & JP–A–02 143566 (Toshiba Corp.).

Patent Abstracts of Japan, vol. 005, No. 040 (E–049), Mar. 17, 1981 & JP–A–55 163877 (Toshiba Corp.).

European Search Report from European Patent Application No. 9583045.5, filed Oct. 30, 1995.

European Search Report from European Patent Application 95830418.0, filed Oct. 9, 1996.

European Search Report from European Patent Application No. 95830468.5. filed Nov. 6, 1995.

European Search Report from European Patent Application No. 95830453.7, filed Oct. 30, 1995.

European Search Report from European Patent Application No. 95830542.7, filed Dec. 28, 1995.

Patent Abstracts of Japan, vol. 015, No. 422 (E–1131), Nov. 11, 1991 & JP–A–03 185737 (Toshiba Corp.).

Patent Abstracts of Japan, vol. 011, No. 231 (E–527), Jul. 28, 1987 & JP–A–62 047162 (Matsushita Electric Works Ltd.).

Patent Abstracts of Japan, vol. 014, No. 038 (E–878), Jan. 24, 1990 & JP–A–01 272163 (Fuji Electric Co. Ltd.).

Patent Abstracts of Japan, vol. 017, No. 039 (E–1311), Jan. 25, 1993 & JP–A–04 256367 (Hitachi Ltd.).

Patent Abstracts of Japan, vol. 017, No. 213 (E–1356), Apr. 26, 1993 & JP–A–04 349660 (Toshiba Corp.).

Patent Abstracts of Japan, vol. 008, No. 053 (E–231), Mar. 9, 1984 & JP–A–58 206174 (Tokyo Shibaura Denki KK ).

Semiconductor Science and Technology, Apr. 1993, UK, vol. 8, No. 4, oo 488–494, Galvagno G., et al. "Diffusion and Outdiffusion of Aluminum Implanted into Silicon".

Stanford Electronics Laboratories, Integrated Circuits Laboratory, Stanford University, Stanford, CA, Technical Report No. 4956–1, Mar. 1976, Michael Donald Pocha, "High Voltage Double Diffused MOS Transistors for Integrated Circuits" pp 229–240.

IEEE Journal of Solid–Staate Circuits, vol. SC–11, No. 4, Aug. 1976, Isao Yoshida, et al., "A High Power MOSFET With A Vertical Drain Electrode And A Meshed Gate Structure", pp 472–477.

Siliconix Technical Proposal in response to N.A.F.I., Solicitation #N00163–77–R–1197, Aug. 31, 1977, Labor And Materials to Design, Develop and Fabricate a 500V/2A N–Channel Metal Oxide Semiconductor F.E.T.

IEEE Transactions On Electron Devices, vol. ED–27, No. 2, Feb. 1980, S.C. Sun, et al., "Modeling Of The On–Resistance Of LDMOS, VDMOS, and VMOS Power Transistors", pp 356–367.

International Electron Devices Meeting—Tech. Digest, Dec. 8–10, 1980, Washington, D.C., pp 91–94, J. Mena, et al., "High Frequency Performance Of VDMOS Power Transistors.".

Solid State Electronics, vol. 27, No. 5, pp 419–432, 1984, P. McGregor, et al. "Small–Signal High–Frequency Performance Of Power MOS Transistors".

IEEE Transactions on Electron Devices, vol. ED–31, No. 1, Jan. 1984, pp 109–113, Jose G. Mena, et al., "Breakdown Voltage Design Considerations in VDMOS Structures".

Solid State Electronics, vol. 29, No. 6, pp. 647–656, 1986, Jose G. Mena, et al., "High–Voltage Multiple–Resistivity Drift–Region LDMOS".

Solid State Electronics, 1977, vol. 29, No. 875–878, Surinder Krishna, "Second Breakdown In High Voltage MOS Transistors".

Electronic Design, For Engineers and Engineering Managers—Worldwide, pp 8276–8282, "HEXFET, A New Power Technology Cuts On–Resistance, Boosts Ratings".

ICs and Semiconductors, pp 8272–8275.

Laid Open Patent Specification No. 85073/80, Laid Open Date: Jun. 26, 1980, Patent No. 75/162,677, Kanushiki Kaisha Hitachi Seisakusho, "Methods For Manufacturing Insulated Gate Type Field Effect Transistors".

MOS-TECHNOLOGY POWER DEVICE INTEGRATED STRUCTURE AND MANUFACTURING PROCESS THEREOF

This application is a continuation of Ser. No. 08/605,381, filed Feb. 22, 1996, now U.S. Pat. No. 5,798,554.

BACKGROUND OF THE INVENTION

1. Field of the Invention

The present invention relates to a MOS-technology power device integrated structure, more particularly to a Vertical Double-Diffused power MOS (VDMOS) or an Insulated Gate Bipolar Transistor (IGBT), and to a manufacturing process thereof.

2. Discussion of the Related Art

MOS-technology power devices are particularly suitable for applications wherein high currents at high voltages must be switched in times of the order of some hundreds of nonoseconds. It is therefore necessary to have MOS-technology power devices capable of handling high powers in extremely short times.

Conventional MOS-technology power devices have a cellular structure including several thousand elementary cells integrated in a semiconductor substrate to form a bidimensional array; each elementary cell represents an elementary VDMOS and is connected in parallel to all the other cells, in order to contribute for a given fraction to the overall current of the power device.

MOS-technology power devices of this type are for example described in the U.S. Pat. Nos. 5,008,725, 4,593,302 and 4,680,853.

Each cell includes a polygonal P type body region (square or hexagonal) formed in a lightly doped N type layer; a polygonal source region is provided inside each body region; the polygonal source region defines a polygonal annular portion between the external edge of the source region and the edge of the body region; such polygonal annular portion, covered by a thin oxide layer (gate oxide) and a polysilicon layer (polysilicon gate), forms a channel region of the elementary VDMOS.

The polysilicon gate and the underlying gate oxide form a mesh over the surface of the lightly doped N type layer, since they substantially are continuous layers with openings over the center of the elementary cells. Elongated regions with no elementary cells are provided in the gate oxide and polysilicon layers; at this elongated regions the polysilicon layer is contacted by gate metal fingers extending from a gate metal pad. The remaining surface of the chip is covered by a source metal layer contacting the source regions of all the elementary cells.

The cellular structure allows achievement of high channel lengths per unit area; this in turn limits the voltage drop across the power device when it is in the "on" state (i.e. the so-called "on-state resistance" $R_DSon$): this is an important parameter, because it is directly related to the steady-state power dissipation of the power device.

However, due to the fact that the resistivity of polysilicon is not negligible, a parasitic resistance is intrinsically introduced by the polysilicon layer in series between the gate metal pad and the gate of the cells; the farther a cell from a gate metal finger, the higher its gate resistance. Such a resistance, together with the input capacitances of the cells and with other parasitic capacitances (e.g. the parasitic capacitances between the polysilicon gate and the substrate in the area between the cells), forms an RC circuit which strongly affects the dynamic performances of the power device.

Although the polysilicon gate layer is normally doped to reduce its resistivity, the effects on the dynamic performances of the power device are limited.

A significant improvement would be obtained augmenting the number of gate metal fingers, thus reducing the spacing between them; this obviously reduces the gate resistance of the elementary cells, but at the expense of a reduction in the channel length per unit area, and thus with an increase in the $R_DSon$.

Furthermore, since in order to maximize the chip area which contributes to the current conduction in the on state (active area) it is now common to provide a bonding pad for the source lead directly over the active area of the chip (a technique known as "bonding on active area"), the region of the chip where said bonding pad is formed cannot be traversed by gate metal finger, because otherwise a short-circuit would be caused between source and gate due to the bonding of the source lead. The area of the bonding pad is such that the regular distance between adjacent gate metal fingers cannot be respected. As a consequence, the portion of active area under the source bonding pad is the last to be affected by the gate signal, and the elementary VDMOS' in said portion of the active area are therefore the last to be turned on/off when the power device is driven on/off.

The parasitic capacitances can be controlled by using a thicker gate oxide: this however has an impact on the threshold voltage of the power device.

A reduction in the spacing between the cells also allows limitation of the parasitic capacitances, but again at the expense of an increase in the $R_DSon$.

In view of the state of the art described, it is an object of the present invention to provide a new MOS-technology power device integrated structure which overcomes the above-mentioned problems; more specifically, the new MOS-technology power device structure shall have good dynamic performances but not at the expense of the steady-state performances.

SUMMARY OF THE INVENTION

According to the present invention this and other objects are attained by means of a MOS-technology power device integrated structure comprising a first plurality of elongated doped semiconductor stripes of a first conductivity type formed in a semiconductor layer of a second conductivity type, each of said elongated stripes including an elongated source region of the first conductivity type, an annular doped semiconductor region of the first conductivity type formed in the semiconductor layer and surrounding and merged with said elongated stripes, first insulated gate stripes extending over the semiconductor layer between adjacent elongated stripes, a plurality of conductive gate fingers extending over and electrically connected to said first insulated gate stripes, and a plurality of source metal fingers, each one extending over a respective elongated stripe and contacting said elongated stripe and the respective elongated source region, so that the source metal fingers and the conductive gate fingers are interdigitated.

A MOS-technology power device structure according to the present invention no longer has a cellular structure; the "body regions" are represented by said elongated doped semiconductor stripes, and the channel is an elongated portion of said elongated stripes defined by the elongated source region. Each first insulated gate stripe, which is associated with two elongated channel regions defined in the adjacent elongated stripes by the respective elongated source regions, is contacted by a respective conductive gate finger, such as a metal finger or a metal silicide finger. Thus, even if the resistivity of the insulated gate layer (polysilicon) is relatively high, the parasitic gate resistance of the power device is quite small. The dynamic performance of the power devices is thus improved, but not at the expense of the static performance.

In a preferred embodiment, a second plurality of elongated doped semiconductor stripes of the first conductivity type is also provided, these further elongated stripes being also merged with said annular region; each elongated stripe of this second plurality is located under a respective first insulated gate stripe, so that the elongated stripes of the first plurality are intercalated with the elongated stripes of the second plurality.

The elongated stripes of the second plurality, being merged with the annular region are at the same electric potential as the elongated stripes of the first plurality, i.e. at the source potential. The presence of a doped semiconductor stripe of the first conductivity type under the insulated gate layer has two major advantages. First, it allows an improvement in the dynamic performance of the power device: in fact, being the stripe at the source potential, the parasitic capacitance associated to the insulated gate layer is an input capacitance (i.e. a capacitance between gate and source), while if the stripe were absent the parasitic capacitance would be between gate and drain (the semiconductor substrate). Due to the Miller effect, a capacitance between gate and drain affects the dynamic performance more negatively than an input capacitance. Second, the presence of the doped semiconductor stripes under the first insulated gate stripes allows flattening of the electric field lines in the regions between the elongated stripes when the device is strongly reverse-biased (high reverse voltage applied between source and drain). Crowding of the electric field lines is thus avoided, so that early breakdowns at the edges of the doped semiconductor stripes are prevented. This leads to an increase in the breakdown voltage of the power device.

Preferably, heavily doped semiconductor stripes of the second conductivity type are provided between the doped semiconductor stripes of the first and second pluralities.

The presence of heavily doped stripes of the first conductivity type at the sides of the doped semiconductor stripes forming the "body regions" of the power device leads to a reduction in the $R_D$Son.

The insulated gate layer is insulated from the underlying semiconductor layer by means of an oxide layer.

In one embodiment of the present invention, such an oxide layer has a uniform thickness, equal to the thickness of a thin gate oxide over the channel regions.

In another, preferred embodiment of the invention, such an oxide layer comprises thin gate oxide areas over the channel regions, and thicker oxide areas between the elongated stripes of the first plurality, in particular over the elongated semiconductor stripes of the second plurality.

The use of a thicker oxide layer over the regions between the "active" stripes (i.e. the elongated stripes of the first plurality, containing the source regions) reduces the parasitic capacitance between gate and source, thus improving the dynamic performance of the device. Moreover, it is advantageous from the point of view of the manufacturing yield, since it is known that thin oxide layers over heavily doped regions are quite defective.

Preferably, the first insulated gate stripes extends from an insulated gate ring surrounding and merged with the first insulated gate stripes.

In a preferred embodiment, at least one second insulated gate stripe is provided extending orthogonally to the first insulated gate stripes between two opposite sides of the insulated gate ring, and located under a source bonding pad.

In a preferred embodiment, under said at least one second insulated gate stripe a respective doped semiconductor stripe of the first conductivity type is provided, which is also merged with the annular doped semiconductor region.

BRIEF DESCRIPTION OF THE DRAWINGS

These and other features of the present invention will be made more evident by the following detailed description of some particular embodiments, described as non-limiting examples with reference to the annexed drawings, wherein.

DETAILED DESCRIPTION

Figure 1:
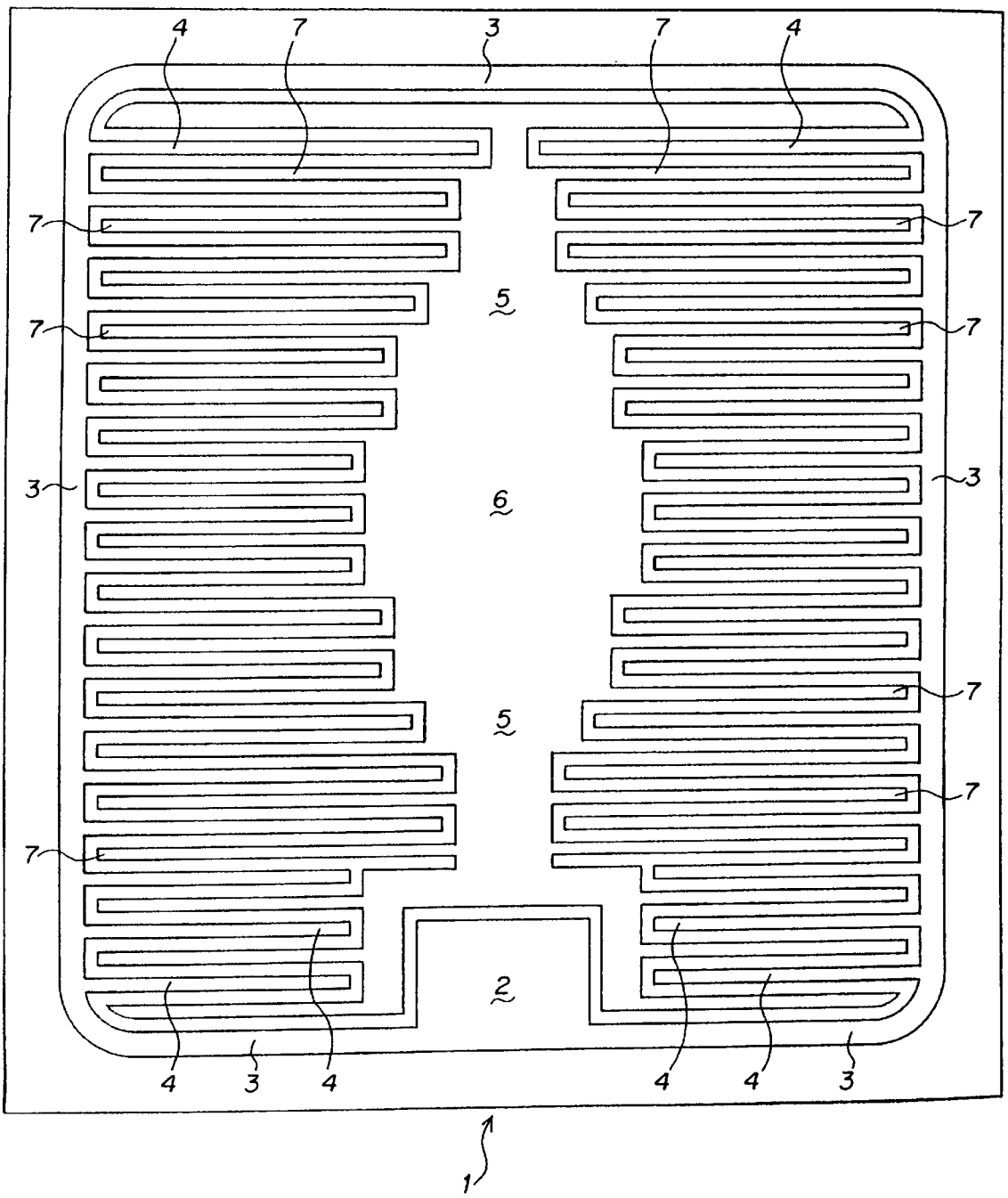
FIG. 1 is a schematic top-plan view of a MOS-technology power device chip according to the present invention.

FIG. 1 schematically shows in top-plan view a chip 1 of a MOS-technology power device according to a first embodiment of the present invention. The chip 1 is provided, near its periphery, with a gate metal pad 2; a gate metal ring 3 running along the periphery of the chip 1 is connected at its edges to the gate pad 2. Conductive gate fingers 4, for example of metal, depart horizontally from the gate ring 3 and extend towards the center of the chip 1.

At the center of the chip 1 a source metal plate 5 is provided; the source plate 5 has a central enlarged pad area 6; source metal fingers 7 depart horizontally from the source plate 5 towards the periphery of the chip 1 and are interdigitated with the gate fingers 4. The source metal plate 5 is rather narrow near the periphery of the chip 1 and becomes progressively wider approaching the pad area 6; this is because the source plate 5 must sustain a current which is smaller near the periphery of the chip 1 (where the current is the sum of a small number of contributions from the individual source fingers 7) and which becomes larger approaching the source pad area 6.

Figure 2:
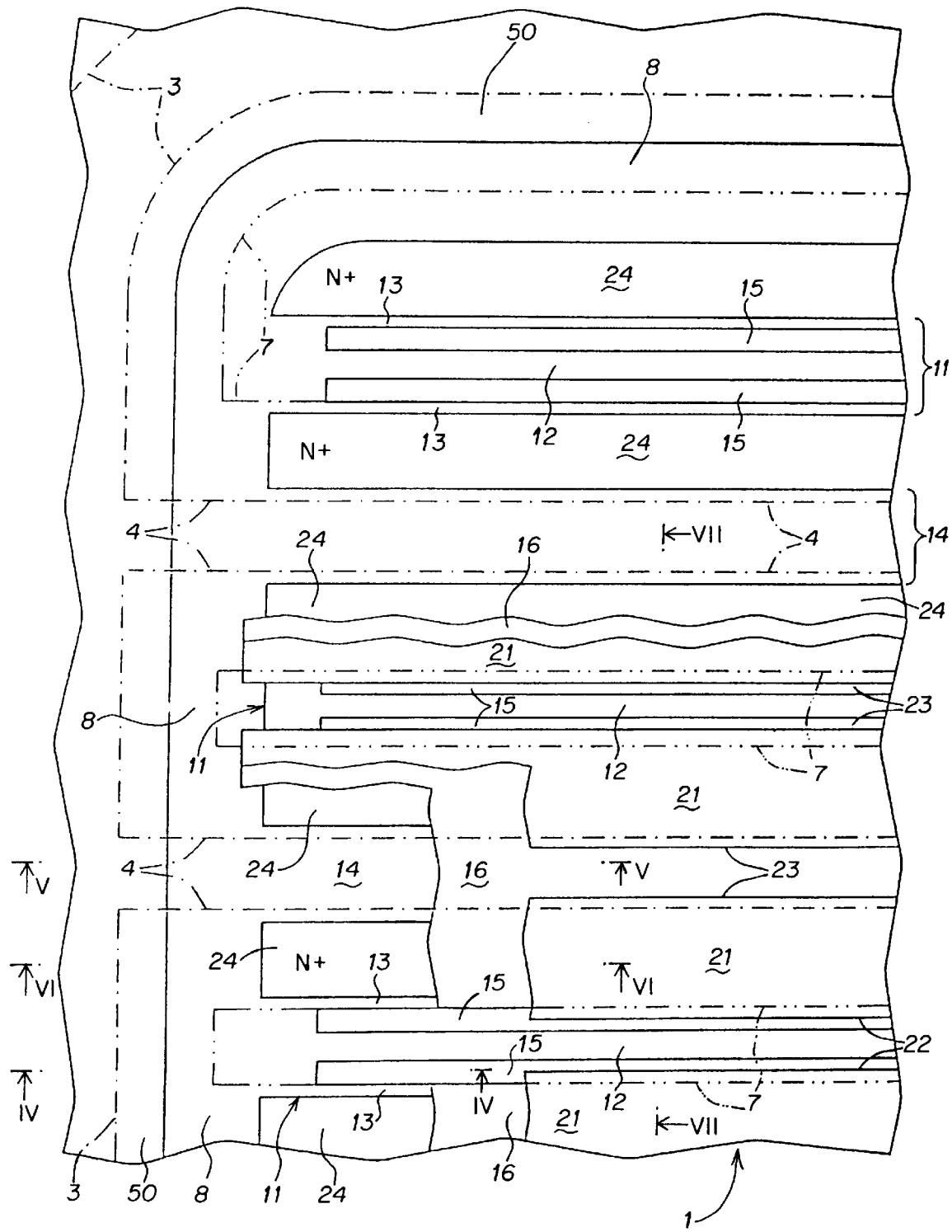
FIG. 2 is an enlarged view of a corner region of the chip of FIG. 1.

FIG. 2 is an enlarged top-plan view of a corner region of the chip 1 of FIG. 1, more precisely the upper-left corner; the gate ring 3, the gate fingers 4 and the source fingers 7 are shown in phantom for the sake of clarity. A P+ ring 8 concentrical with the gate metal ring 3 is visible; as shown in the cross-sectional views of FIGS. 4, 5 and 6, the P type ring 8, which in the shown embodiment is a P+ heavily doped ring, is formed in a N-semiconductor layer 9 (typically a lightly doped epitaxial layer). The N− layer 9 is in turn superimposed on a heavily doped semiconductor substrate 10; the substrate 10 can be either of the N type, in the case of a power VDMOS, or of the P type, in the case of an Insulated Gate Bipolar Transistor (IGBT). All the conductivity types given above relates to N-channel devices; for P-channel devices all the conductivity types must be reversed. A P− ring 50 is provided all around the P+ ring 8 (FIGS. 2 and 4–6); the P− ring 50 forms in a per-se known way an edge structure for the P+ ring 8, and spreads the depletion region associated to the junction between the P+ ring 8 and the N− layer 9, thus increasing the breakdown voltage of the power device.

Figure 4:
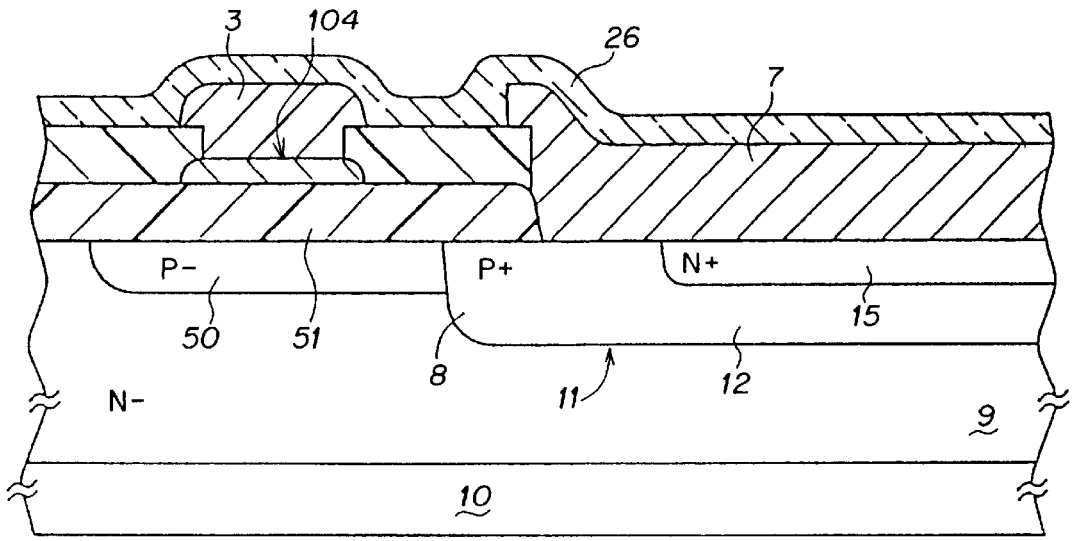
FIG. 4 is a cross-sectional view taken along line IV—IV of FIG. 2.

As visible in FIGS. 2 and 4, a first plurality of P type stripes 11 departs horizontally from the P+ ring 8. The stripes 11 forms so-called "body regions" of the power device; as better visible in FIG. 7 (which is a cross-section in a direction transversal to the stripes 11), each stripe 11 comprises a central P+ portion 12 (analogous to the so-called "deep body region" of the cellular devices of the known art) and two shallower and more lightly doped portions 13 at the sides of and merged with the P+ portion 12. Also, inside each stripe 11 two N+ source stripes 15 are provided; the N+ source stripes 15 substantially extends for the whole length of the stripe 11 (see FIG. 4). In alternative, the N+ source stripes 15 can be provided with periodic interruptions (FIG. 20), for reasons which will be explained later on.

Figure 5:
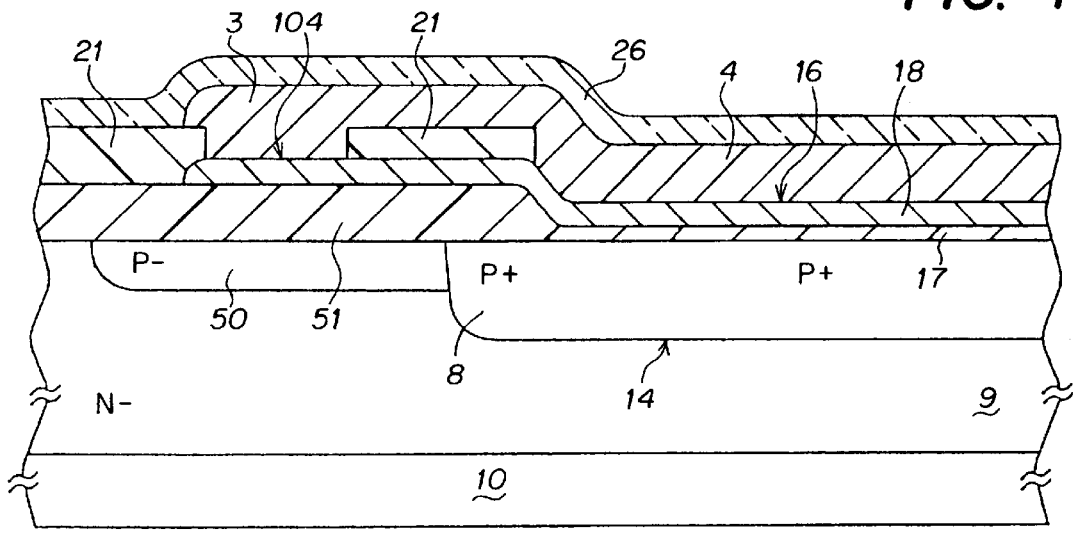
FIG. 5 is a cross-sectional view taken along line V—V of FIG. 2.

As also shown in FIGS. 2 and 5, a second plurality of P type stripes 14 (which in the shown embodiment are heavily doped P+ stripes) also departs horizontally from the P+ ring 8. The stripes 14 of the second plurality are intercalated with the stripes 11 of the first plurality, i.e. between two stripes 11 there is always provided a stripe 14.

Figure 17:
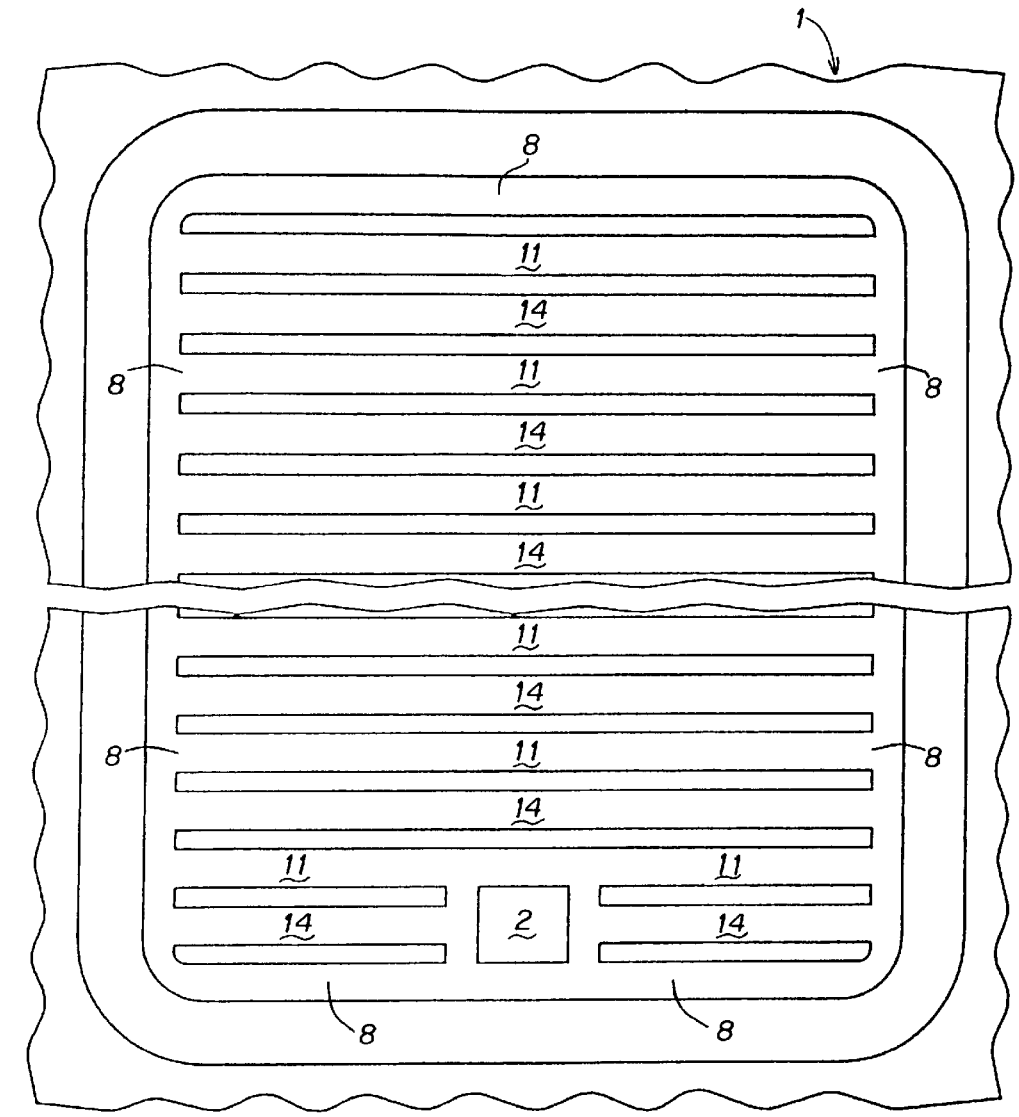
FIG. 17 is a schematic top-plan view of the MOS-technology power device integrated structure after the step of FIG. 14.

As schematically shown in FIG. 17, in this first embodiment of the invention both the stripes 11 and the stripes 14 extend horizontally for substantially the whole length of the chip 1, and are merged at both their edges with the P+ ring 8; only in a chip region under the gate metal pad 2 the stripes 11 and 14 do not extend for the whole length of the chip, but they are however merged at both sides with the P+ ring 8.

Figure 6:
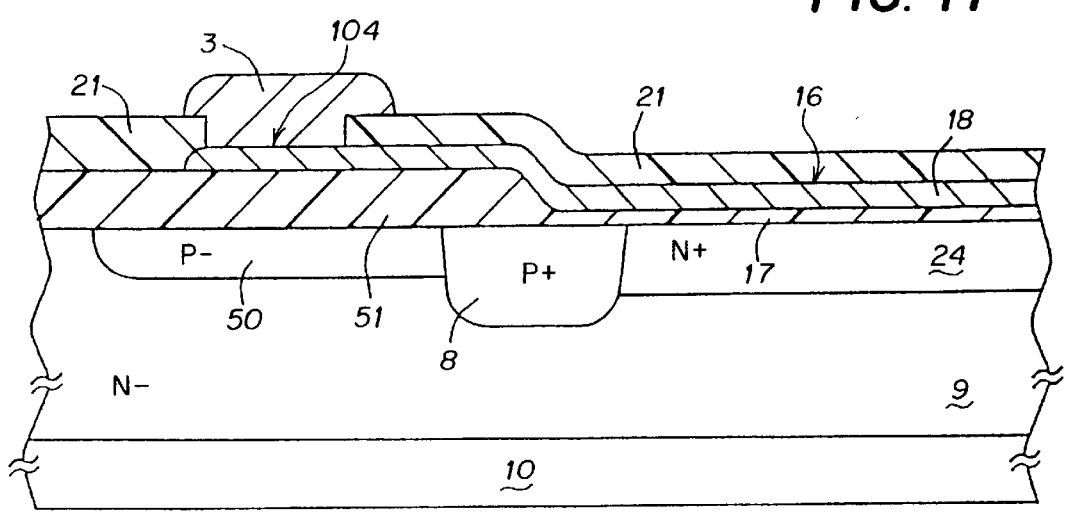
FIG. 6 is a cross-sectional view taken along line VI—VI of FIG. 2.

As shown in FIGS. 2 and 6, N+ stripes 24 extend horizontally between the stripes 11 and 14. The stripes 24 are completely isolated one from the other, being surrounded at each side by P type regions.

As shown in FIG. 2, stripes 16 of a conductive insulated gate layer are placed over the P+ stripes 14. The insulated gate stripes 16 extend from an insulated gate ring 104 running along the periphery of the chip over the P type rings 8 and 50. Each stripe 16 partially extends over the lightly doped portions 13 of two adjacent stripes 11.

Figure 7:
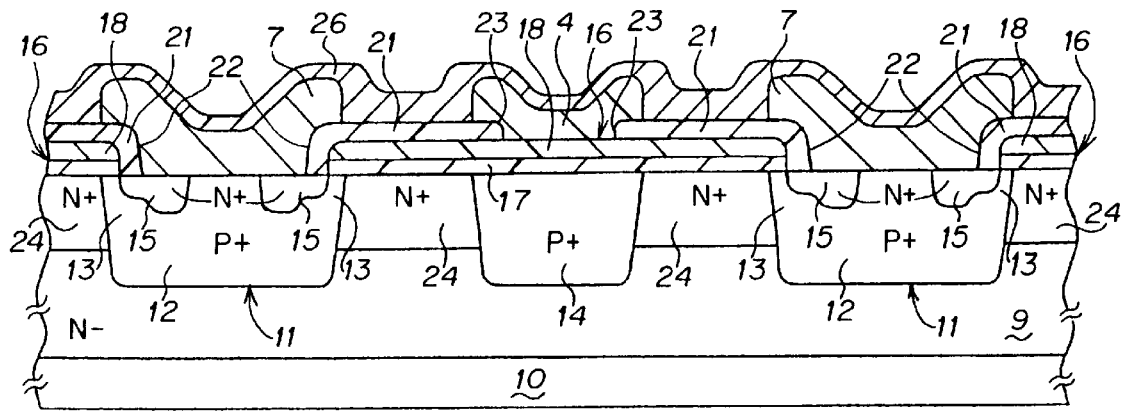
FIG. 7 is a cross-sectional view taken along line VII—VII of FIG. 2.

As shown in FIG. 7, the insulated gate layer comprises an oxide layer 17 and a polysilicon gate layer 18. In one possible variation of the invention, the oxide layer 17 is rather thin and has a uniform thickness. In a preferred variation of the invention, shown in FIG. 9, the oxide layer 17 comprises thin gate oxide portions 19 which extend over the lightly doped portions 13 of the stripes 11, and thicker portions 20 over the P+ stripes 14. As previously noted, the use of a thicker oxide layer over the P+ stripes 14 reduces the parasitic capacitance between the polysilicon gate layer 18 and the P+ stripes 14, i.e. the gate-source (input) parasitic capacitance, thus improving the dynamic performances of the device. Also, it is advantageous from the point of view of the manufacturing yield, since it is known that heavily doped semiconductor regions such as the P+ stripes 14 getter metal contaminants, and when a thin oxide layer is formed over such heavily doped regions these contaminants migrate in the oxide layer inducing defects.

Figure 20:
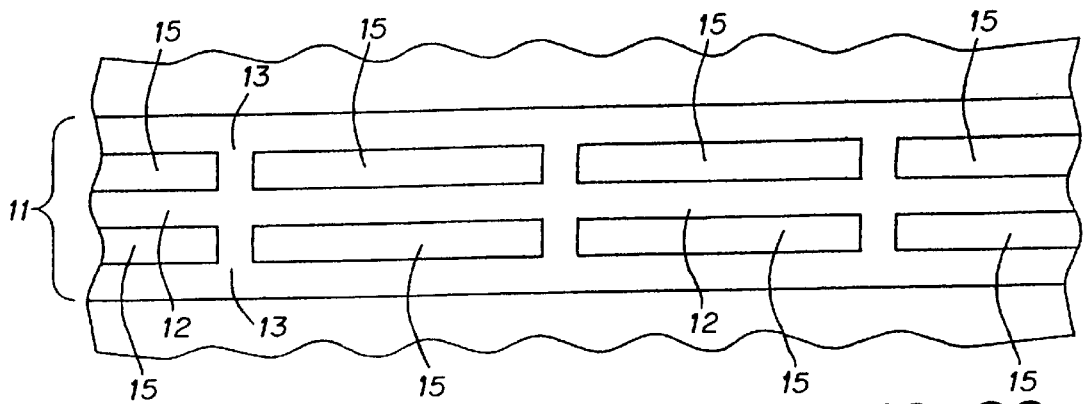
FIG. 20 is a detailed top-plan view of a portion of a body region of the MOS-technology power device of the present invention, in one particular embodiment.

A dielectric layer 21 is placed over the insulated gate stripes 16; elongated windows 22 and 23 are provided in the dielectric layer 21 respectively over the center of the stripes 11 and over the center of the stripes 14. Each source metal finger 7, placed over the dielectric layer 21, contacts the N+ source stripes 15 and the P+ portion 12 of a respective stripe 11; each gate finger 4, also placed over the dielectric layer 21, contacts a respective underlying stripe 16 of insulated gate layer. The gate fingers 4 can be made of metal, exactly as the source fingers 7, or they can be made of a silicide. In the case the N+ source stripes 15 are provided with periodic interruptions, as shown in FIG. 20. a better short-circuit of the whole P+ portion 12 (including the part of the P+ portion 12 under the N+ source stripes 15) with the N+ source stripes 15 is achieved; this assures that the parasitic bipolar transistor with emitter, base and collector represented by the regions 15, 12 and 9 has the base short-circuited with the emitter.

The P− ring 50 which surrounds the P+ ring 8 is covered by a thick field oxide layer 51; the polysilicon layer 18 extends over the field oxide layer 26, where it is contacted by the gate ring 3.

Figure 3:
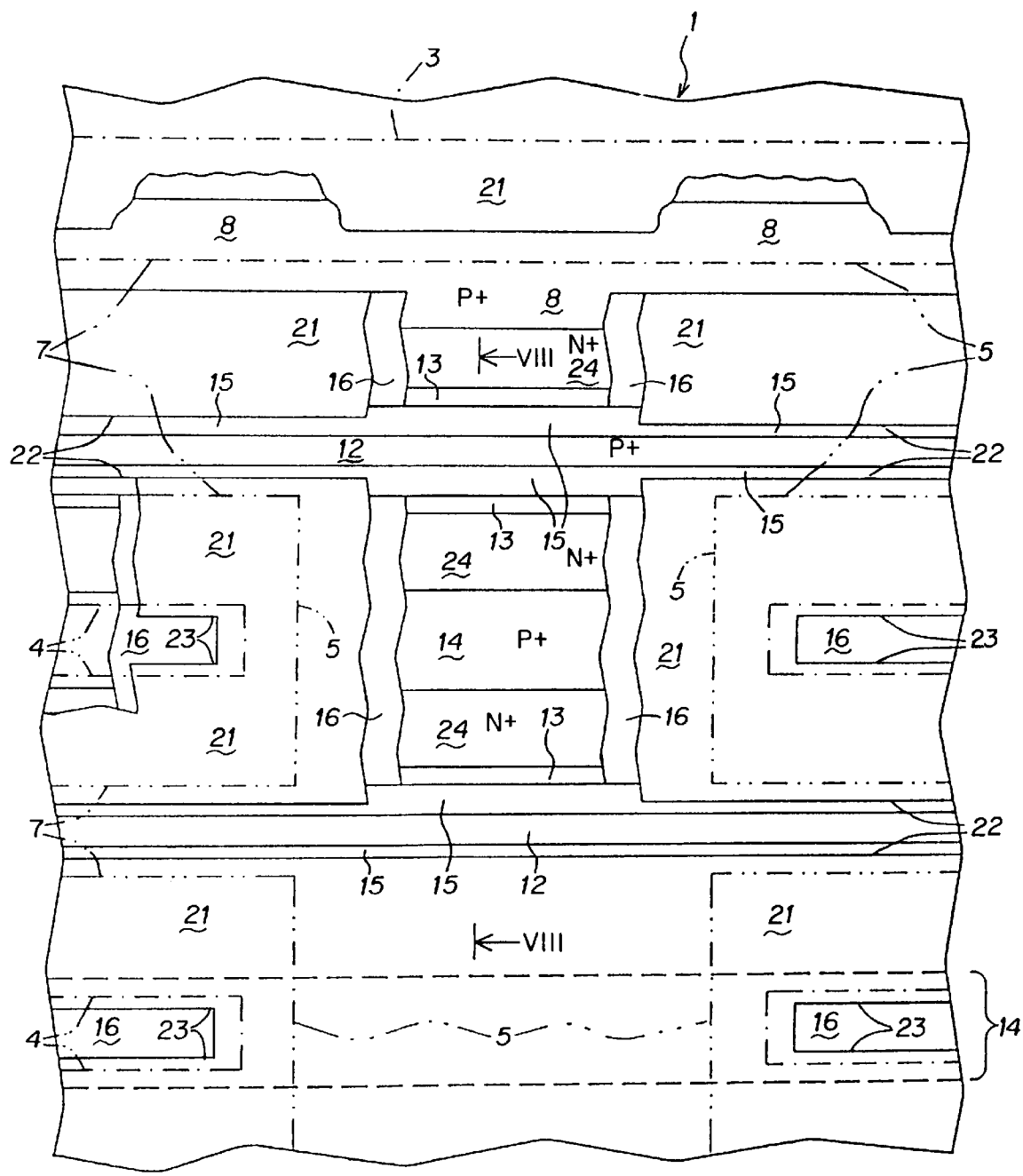
FIG. 3 is an enlarged view of another region of the chip of FIG. 1 in a first embodiment of the present invention.
Figure 8:
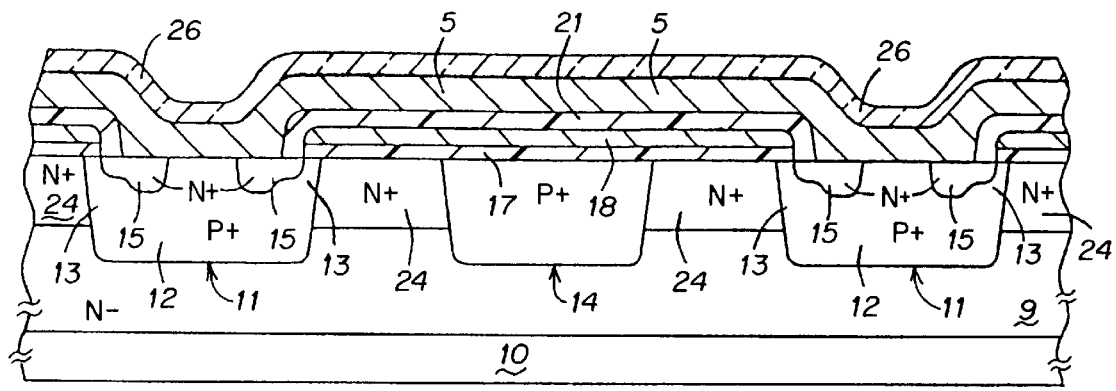
FIG. 8 is a cross-sectional view taken along line VIII—VIII of FIG. 3.

As shown in FIG. 3, which is an enlarged view of upper-central portion of the chip of FIG. 1, the windows 22 in the dielectric layer 21 extends horizontally for substantially the whole length of the chip 1; thus, at the center of the chip 1 the P+ portion 12 and the N+ source stripes 15 of each stripe 11 can be contacted by the source metal plate 5. The windows 23 instead do not extend for the whole length of the chip, being interrupted at the center of the chip 1 near the source plate 5, to prevent the source plate 5 to come into contact with the insulated gate layer 16. This clearly appears from FIGS. 8 and 10, which similarly to FIGS. 7 and 9 respectively illustrates the two possible embodiments of the invention with respect to the structure of the oxide layer 17.

The whole chip is covered by a passivating layer 26, in which windows are opened over the gate metal pad 2 and the pad area 6 of the source metal plate 5.

The presence of the P+ stripes 14 under the insulated gate layer 16 between adjacent "body region" stripes 11 has two major advantages. Firstly, it allows an improvement in the dynamic performances of the power device: in fact, being the P+ stripes 14 at the source potential (because they are merged with the P+ ring 8), the parasitic capacitance associated with the insulated gate layer 16 is an input capacitance, i.e. a capacitance between gate and source, while if the stripe were absent the parasitic capacitance associated to the insulated gate layer 16 would be a capacitance between the polysilicon gate 18 and the N− layer 9, i.e. a gate-drain capacitance. Due to the Miller effect, a gate-drain capacitance affects more negatively the dynamic performances than an input capacitance. Secondly, the P+ stripes 14 allow flattening of the electric field lines in the regions of the N− layer 9 between the stripes 11 when the device is strongly reverse-biased (high reverse voltage applied between source and drain). Crowding of the electric field lines is thus avoided, so that early breakdowns at the edges of the doped semiconductor stripes are prevented; this leads to an increase in the breakdown voltage. Experimental tests have proven that breakdown voltages of up to 40 V are attainable.

The presence of the N+ stripes 24 allows a reduction in the "on resistance" $R_D Son$ of the power device.

Figure 19:
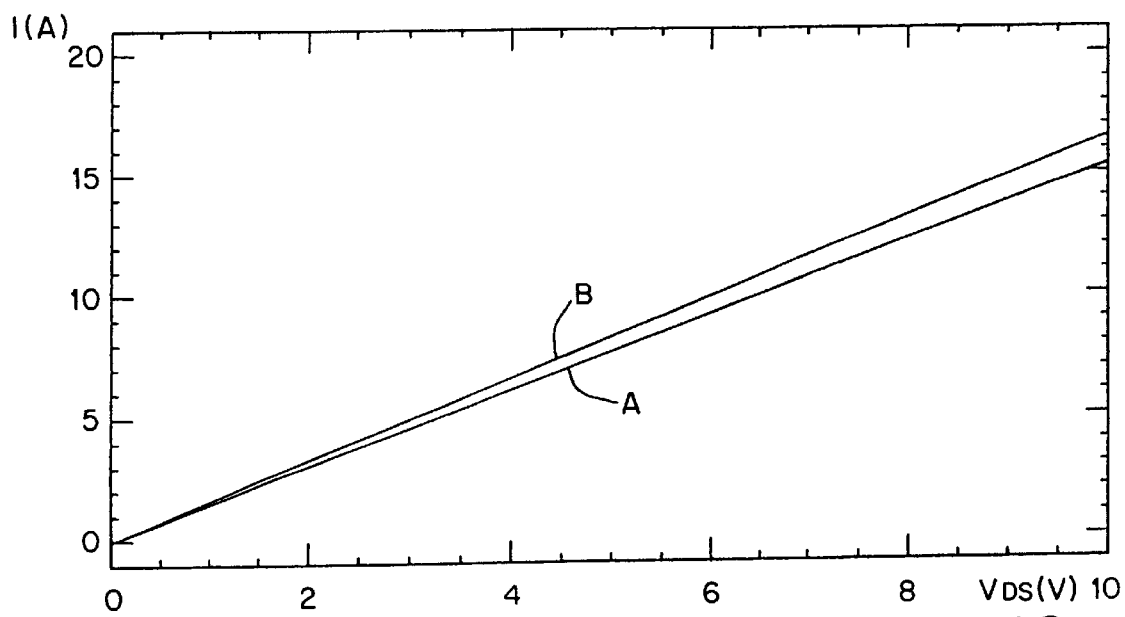
FIG. 19 is a diagram comparatively showing current-voltage characteristics for a cellular power device of the known art and for the power device of the present invention.

It has been experimentally proven that a MOS-technology power device integrated structure according to the present invention shows a gate resistance ($R_g$) varying between 0.7 and 1 Ohm, while a cellular structure device according to the known art shows typical gate resistance values ranging from 2.2 and 3.1 Ohms; thus, the gate resistance of the power device structure of the present invention is significantly lower than that of known power devices, and is less dispersed. Such a reduction in the gate resistance has not been achieved at the expense of the on-state resistance $R_D Son$. Experimental tests, shown in FIG. 19, have proven that the power device structure of the present invention has a lower $R_D Son$ than known cellular power devices. In FIG. 19, which is a source current vs drain-source voltage plot, curve A refers to a cellular power device according to the known art, and curve B refers to a power device according to the present invention: it appears that for any drain-source voltage value, the source current sunk by the power device according to the invention is higher than that of the cellular power device. It should be appreciated that such improvements have been obtained only by means of a different layout technique, and not in the manufacturing technology.

A manufacturing process for a MOS-technology power device according to the first embodiment of the present invention starts with a heavily doped semiconductor substrate 10. A lightly doped layer 9 is epitaxially grown over the substrate 10; the lightly doped layer 9 is of the N type for an N-channel device, and of the P type for a P-channel device.

Figure 11:
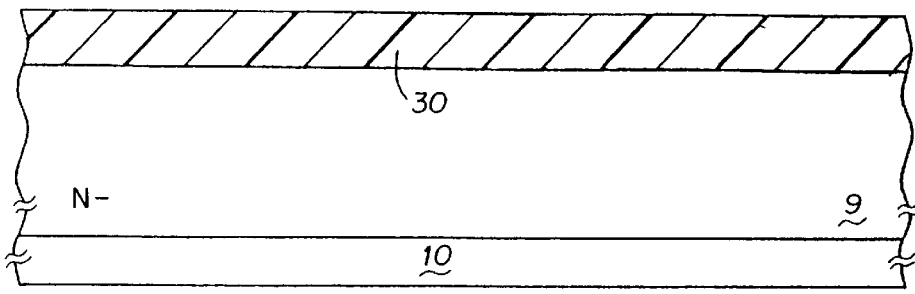
FIGS. 11 to 16 are cross-sectional views taken along line VII—VII of FIG. 2 showing some steps of a process for the manufacturing of a MOS-technology power device according to the first embodiment of the invention.
Figure 12:
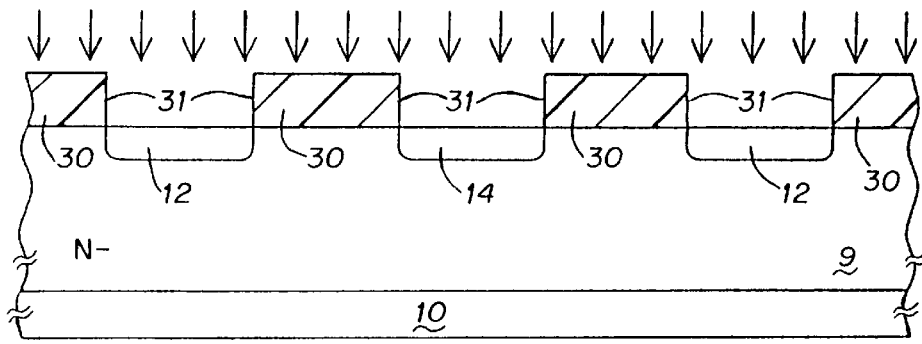

A thick field oxide layer 30 is formed over the N− layer 9 (FIG. 11). The field oxide layer 30 is then selectively removed to open in it windows 31 for the implantation of a P type dopant, to form the P type ring 8, the P+ portions 12 of the stripes 11 and the P type stripes 14. The implant dose is between $10^{15}$–$10^{16}$ atoms/cm$^2$ (FIG. 12). After this implantation, the filed oxide layer 30 is again selectively removed, and a P type dopant is implanted in a dose of about $10^{12}$ atoms/cm$^2$ to form the P− ring 50.

Figure 13:
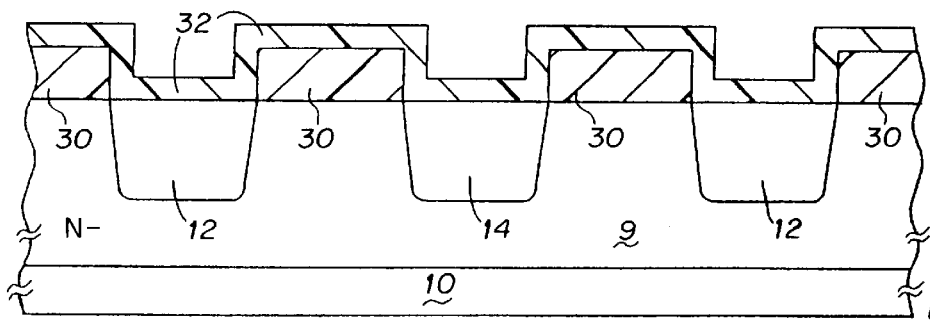
Figure 14:
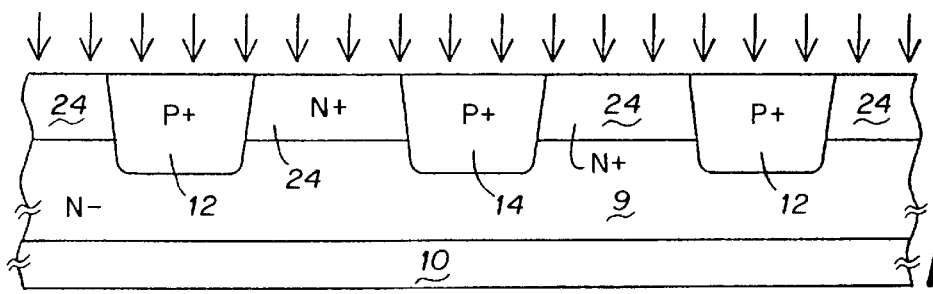

A thermal diffusion process is then performed submitting the chip to a temperature of about 1100–1200° C. for two-three hours, to make the implanted dopant diffuse. Successively, the chip is submitted to a temperature of about 1000° C. for five-six hours: an oxide layer 32 about 13000 Angstroms thick grows over the whole surface of the chip 1 (FIG. 13). The oxide layers 32 and 30 are then completely removed except that near the edges of the chip (over the P− ring 50, see FIGS. 4–6), and an N type dopant is implanted to form the N+ stripes 24; the implantation dose, of the order of $10^{12}$ atoms/cm$^2$, is sufficiently low so as not to reverse the conductivity type of the already formed regions 12 and 14. After the implantation, an annealing treatment is performed (FIG. 14).

A thin gate oxide layer 17 is then formed over the surface of the chip; the oxide layer 17 has a typical thickness of about 1000 Angstroms.

Figure 15:
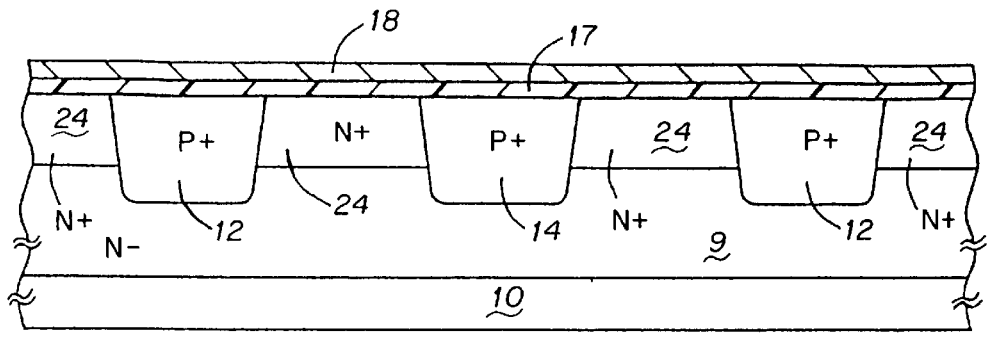

A polysilicon layer 18 is deposited over the gate oxide layer 17 (FIG. 15).

The polysilicon layer 18 and the oxide layer 17 are then selectively removed over the stripes 12 to define the insulated gate stripes 16 and the insulated gate ring 104.

Figure 16:
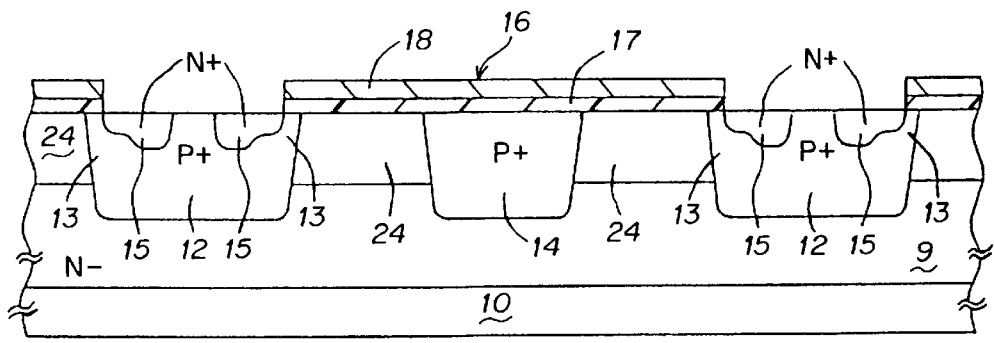

A P type dopant is then implanted in a dose of about $10^{13}$ atoms/cm$^2$ and is then made to diffuse by means of thermal process at a temperature of about 1100° C. for six-seven hours to form the lightly doped portions 13 of the stripes 11 at the sides of the P+ portions 12 (FIG. 16).

An N type dopant is then selectively implanted in the stripes 11 to form the N+ source stripes 15; the N type dopant dose is of the order of $10^{15}$ atoms/cm$^2$. A short thermal diffusion process allows the diffusion of the N type dopant to form the source stripes 15.

A dielectric layer 21 is then deposited over the whole chip, and it is then selectively removed to open the contact windows 22 and 23.

A metal layer is deposited over the dielectric layer 21, and it is selectively removed to define the gate pad 2, the gate ring 3, the gate fingers 4, the source plate 5 and the source fingers 7.

Figure 18:
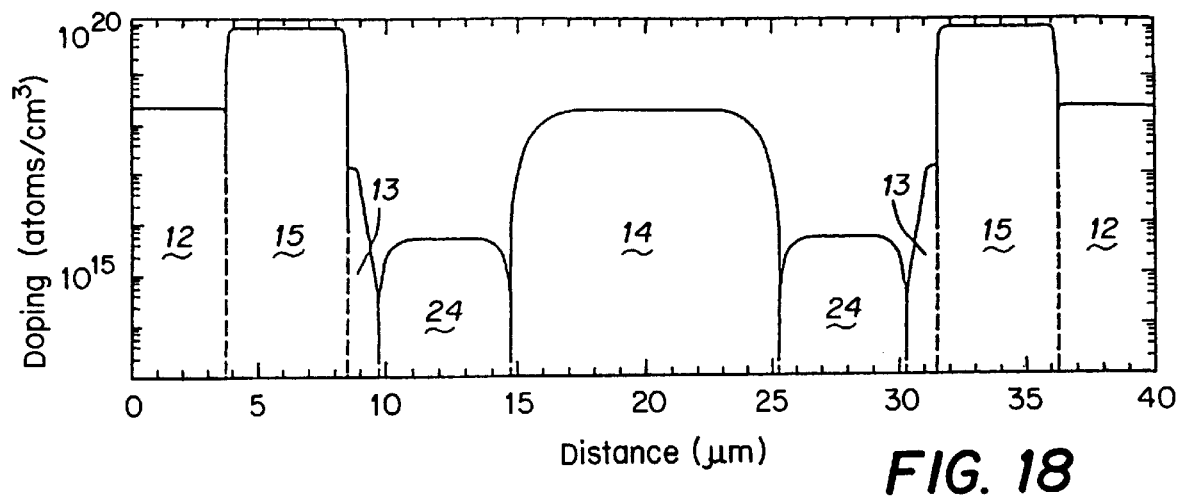
FIG. 18 is a diagram showing doping profiles of several doped regions of the MOS-technology power device structure of the present invention.

FIG. 18 shows the doping profile of the different doped semiconductor regions at the end of the manufacturing process.

Figure 14A:
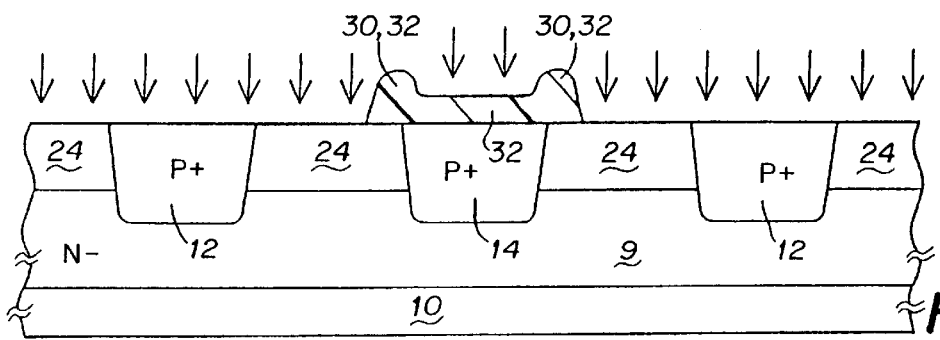
FIGS. 14A is a cross-sectional view showing an alternative step to that of FIG. 14 of a process for the manufacturing of a MOS-technology power device according to the preferred embodiment of the invention.

FIG. 14A show an alternative process step suitable to obtain a structure according to the preferred variation of the invention.

Coming back to FIG. 13, the oxide layers 32 and 30 are not removed from the regions over the P+ stripes 14: in this way, as shown in FIG. 14A, the 13000 Angstroms-thick oxide layer 32 is left over the P+ stripes 14.

Figure 15A:
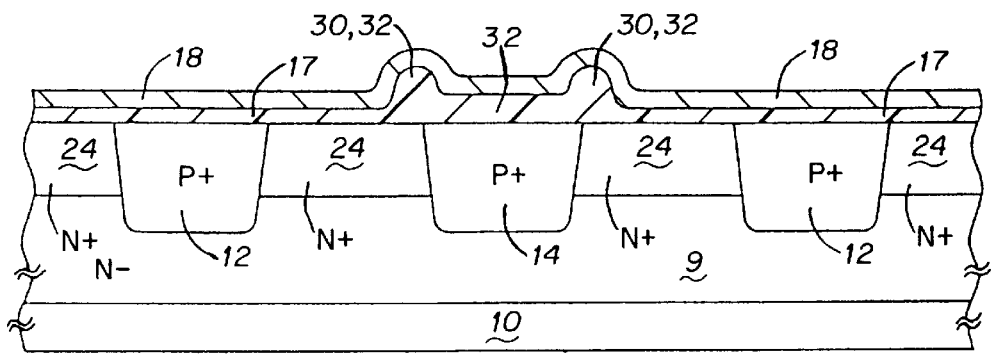
FIGS. 15A and 16A are cross-sectional views showing further steps of the process for the manufacturing of the device according to the preferred embodiment.
Figure 16A:
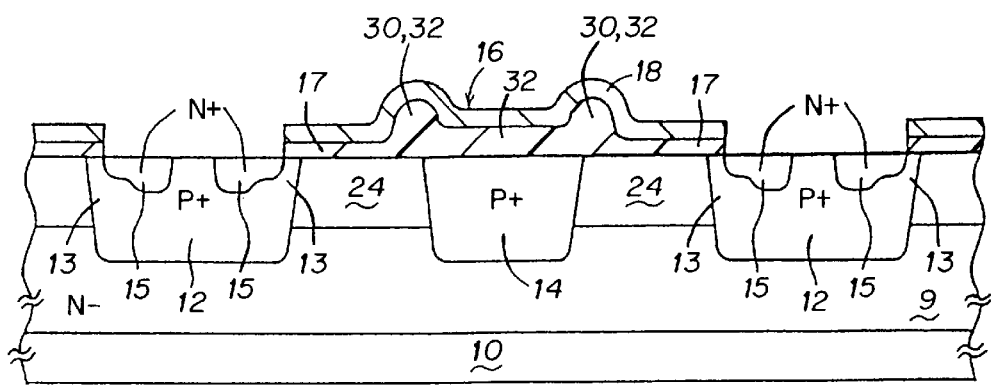

The process goes on in the same way previously described; FIGS. 15A and 16A show the structure according to the preferred variation of the invention after the steps 15 and 16 of the process previously described.

Figure 21:
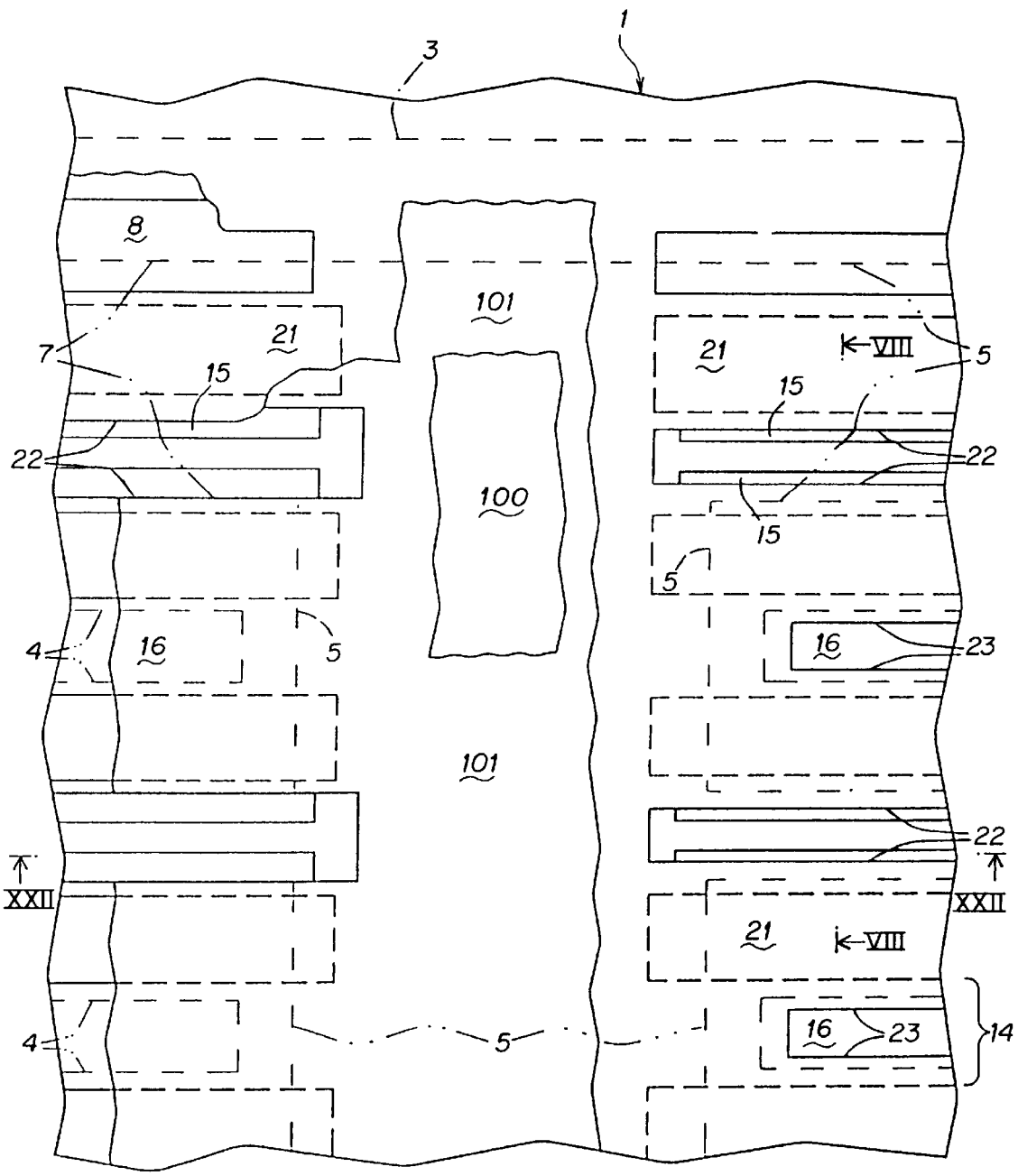
FIG. 21 shows in enlarged view the region of the chip shown in FIG. 3, but is a second embodiment of the invention.
Figure 23:
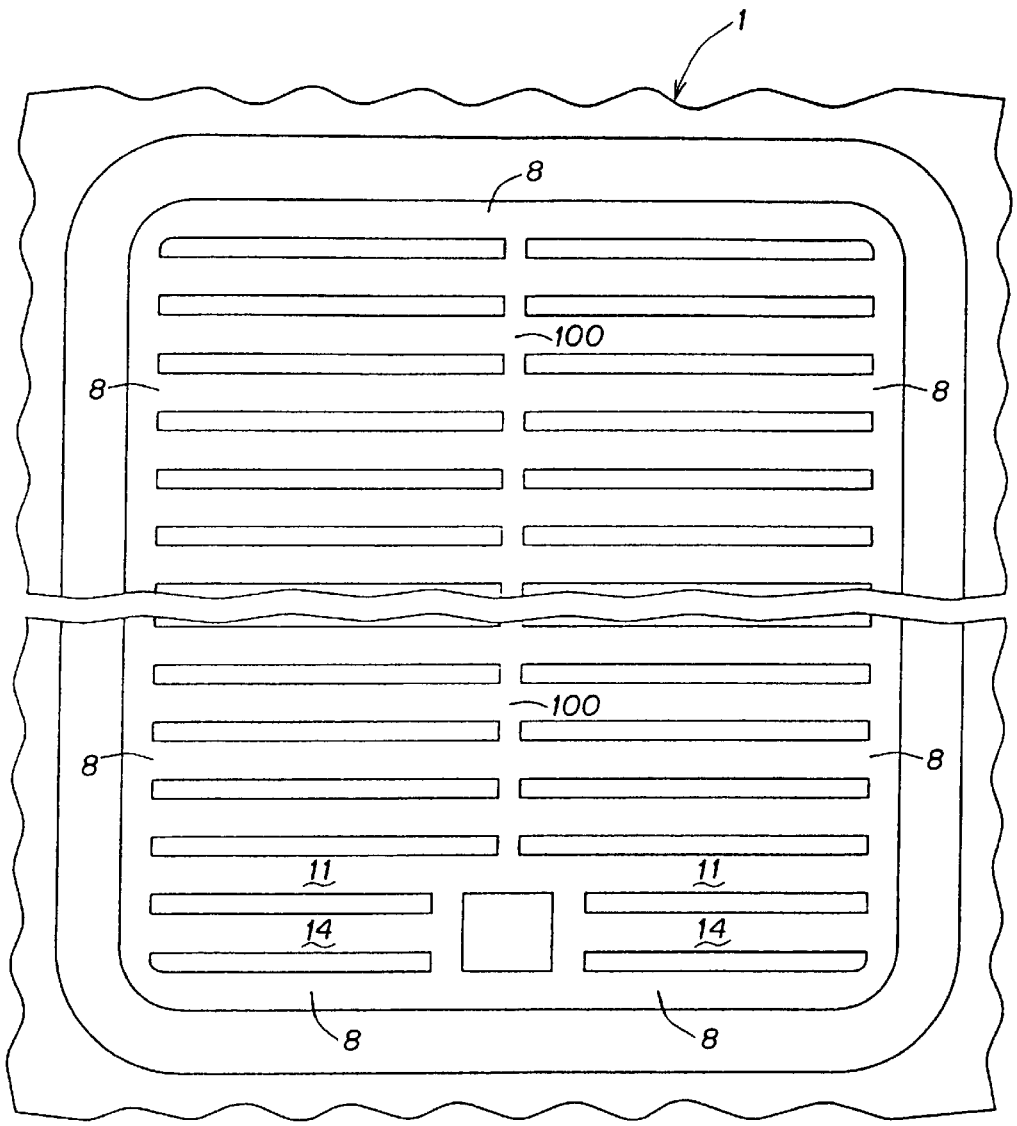
FIG. 23 is a schematic top-plan view similar to FIG. 17 in said second embodiment of the invention.

FIG. 21 shows in an enlarged view of the same region of the chip shown in FIG. 3, but in a second embodiment of the present invention.

Differently from the first embodiment, a further P type stripe 100 extends orthogonally to the stripes 11 and the stripes 14 substantially in the middle portion of the chip, under the source plate 5; the P type stripe 100 is merged at its two ends with the P type ring 8, and the P type stripes 11 and 14 are also merged with the P type stripe 100 at their ends not merged with the P type ring 8. Thus, the P type ring 8, the P type stripes 11 and 14 and the P type stripe 100 are all merged together. Inside the P type body stripes 11 the N+ source stripes 15 extend substantially from the P type ring 8 to the P type stripe 100.

Figure 9:
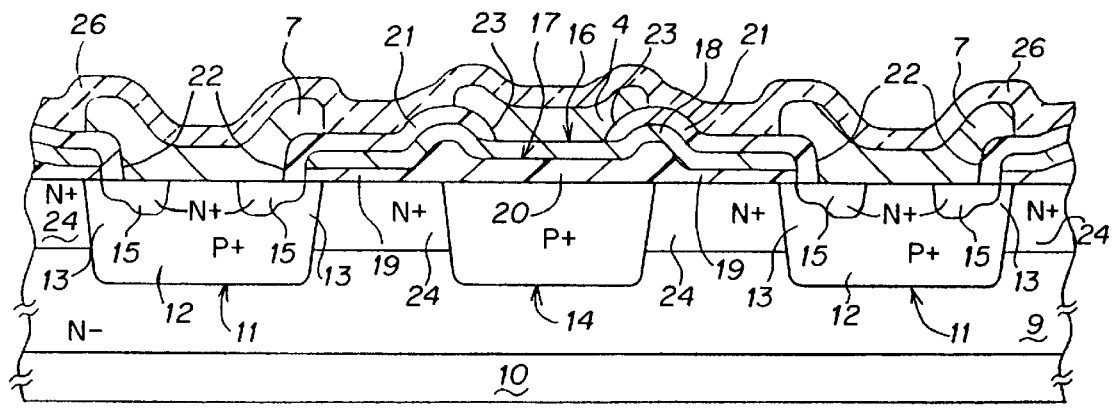
FIG. 9 is similar to FIG. 7, but shows a preferred variation of the first embodiment of the invention.
Figure 10:
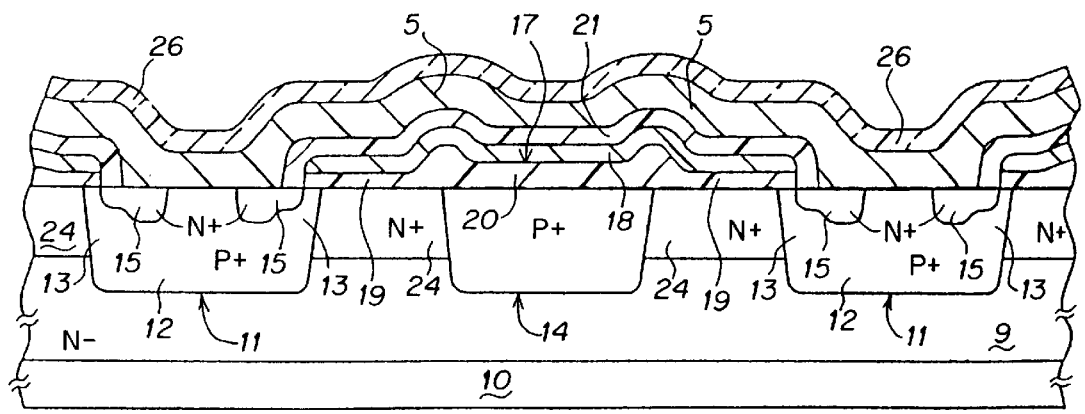
FIG. 10 is similar to FIG. 8, in said preferred variation of the first embodiment.

A stripe 101 of insulated gate layer to which the stripes 16 of insulated gate layer are connected extends vertically from the insulated gate ring 104 over the P type stripe 100 (FIGS. 3 and 9).

Figure 22:
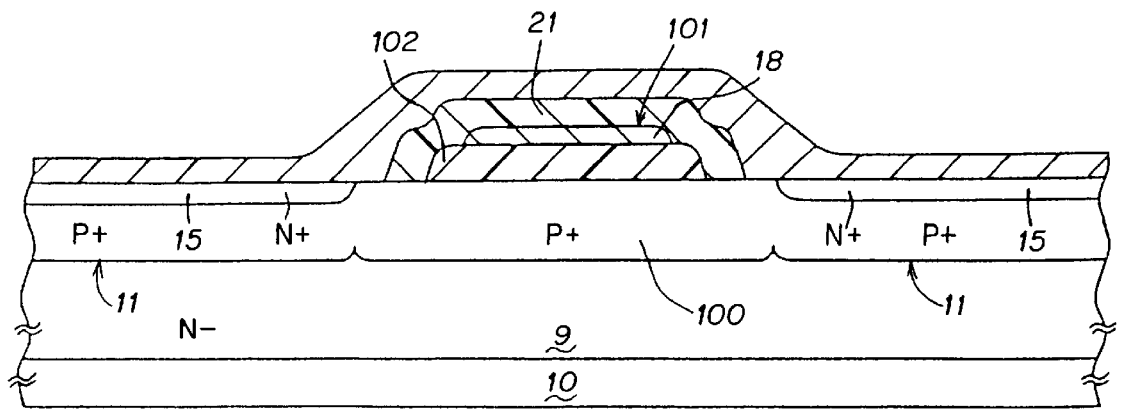
FIG. 22 is a cross-sectional view taken along line XXII—XXII of FIG. 21.

As shown in FIG. 22, over the P type stripe 101 the polysilicon layer 18 is insulated from the underlying P type stripe 100 by a thick oxide layer 102.

As also shown in FIG. 3, the windows 22 in the dielectric layer 21 have all substantially the same length and extend horizontally from the periphery of the chip to the P type stripe 100. At the center of the chip 1, where the source metal plate 5 is wider, the P+ portion 12 and the N+ source stripes 15 of each stripe 11 can be contacted by the source metal plate 5. The windows 23 are interrupted near the source plate 5, to prevent the source plate 5 to come into contact with the insulated gate layer 16 (FIG. 8); the length of the windows 23 becomes shorter going from the upper and lower sides of the chip 1 towards its center, where the source metal plate 5 is wider.

Thanks to the presence of the stripe 101 of insulated gate layer under the source metal plate 5, the gate resistance of the MOS power device is reduced. If the stripe 102 of insulated gate layer were absent, the portions of the body stripes 11 near the center of the chip, especially those under the source metal plate 5 where the insulated gate stripes 16 are not contacted by the gate metal fingers 4, would experience a higher gate resistance than the portions of the body stripes 11 near the periphery of the chip; in other words, the portions of the body stripes 11 under the source metal plate 5 would experience a higher input impedance than the portions of the body stripes 11 near the periphery of the chip. The presence of the central stripe 101 of insulated gate layer greatly reduces this problem, because the portions of the body stripes 11 under the source metal plate 5 can be easily reached by the gate signal.

As in the case of the P type stripes 14 under the insulated gate layer 16 between adjacent body stripes 11, the presence of the P type stripe 100 under the insulated gate stripe 101 allows an improvement in the dynamic performances of the power device.

A manufacturing process for a MOS-technology power device according to the second embodiment of the present invention is substantially similar to that previously described in connection with the first embodiment. In one embodiment of the manufacturing process, the P type stripe 100 is formed by means of the same implantation step which forms the P type ring 8, the P+ portions 12 of the stripes 11 and the P type stripes 14. In another embodiment of the manufacturing process, the P type ring 8, the P type stripes 14 and the P type stripe 100 are formed by means of the same implantation step which forms the P− ring 50. In this case, the P type ring 8, the P type stripes 14 and the P type stripe 100 are lightly doped P− regions, instead of heavily doped P+ type regions.

Another difference with the manufacturing process previously described resides in that the oxide layers 32 and 30 are not removed not only from the regions over the P type stripes 14, but also over the P type stripe 100. Also, the insulated gate stripe 101 is defined in the same step in which the insulated gate stripes 16 are defined.

It will be appreciated by those skilled in the art that the present invention not only applies to discrete power devices, as those previously described, but also to MOS-technology power devices integrated in Vertical Intelligent Power ("VIP") integrated circuits and BCD integrated circuits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A MOS-technology power device integrated structure comprising:
   a plurality of first regions of a first conductivity type having a first doping level formed in a semiconductor layer of a second-conductivity type having a second doping level, each of said first regions including a source region of the second conductivity type;
   a frame region of the first conductivity type formed in the semiconductor layer, surrounding and merged with said first regions at each end of said first regions;
   a plurality of gate regions, each gate region being insulatively disposed over the semiconductor layer between adjacent first regions, and extending over a lateral portion of each adjacent first region;
   a plurality of second regions of the first conductivity type, each second region being merged at each end with said frame region, each second region being located under a respective gate region so that the plurality of first regions are disposed in parallel with the plurality of second regions;
   a plurality of regions of the second conductivity type, each region of the second conductive type being disposed between a respective one of the first and the second regions, and having a third doping level such that a depth into the semiconductor layer of the plurality of regions of the second conductivity type is in a range from shallower than a depth of the source region in the plurality of first regions up to a depth of the plurality of first regions in the semiconductor layer;
   a plurality of gate metal fingers, each gate metal finger extending over and being electrically connected to at least a portion of a respective one of said gate regions; and
   a plurality of source metal fingers, each one extending over at least a portion of a respective first region and contacting the at least a portion of said first region and the respective source region within the at least a portion of the first region, so that the plurality of source metal fingers and the plurality of gate metal fingers are interdigitated.

2. The MOS-technology power device integrated structure according to claim 1, wherein the third doping level is greater than the second doping level and the third doping level is less than or equal to the first doping level.

3. The MOS-technology power device integrated structure according to claim 1 wherein said plurality of gate metal fingers are connected at one end to a gate metal frame surrounding the plurality of gate metal fingers, the gate metal frame being disposed above the frame region.

4. The MOS-technology power device integrated structure according to claim 1, wherein said source metal fingers extend outwardly from a source metal plate disposed above the semiconductor layer.

5. The MOS-technology power device integrated structure according to claim 1, wherein each of the plurality of gate regions is insulatively disposed above the underlying semiconductor layer by an oxide layer.

6. The MOS-technology power device integrated structure according to claim 5, wherein said oxide layer has a uniform thickness.

7. The MOS-technology power device integrated structure according to claim 5, wherein said oxide layer comprises a thick oxide portion disposed under a portion of each gate region and disposed under the respective gate metal finger, and a thin oxide portion disposed under a remaining lateral portion of each gate region, the thin oxide portion extending over the lateral portion of each adjacent first region.

8. The MOS-technology power device integrated structure according to claim 1, wherein each said source region comprises two laterally displaced source regions disposed substantially in parallel within each first region.

9. The MOS-technology power device integrated structure according to claim 8, wherein said two laterally displaced source regions extend for an entire length of each respective first region in which they are included.

10. The MOS-technology power device integrated structure according to claim 1, wherein each first region is an elongated region having a length and each source region includes a plurality of source regions intercalated with portions of the respective first region along the length of the first region.

11. The MOS-technology power device integrated structure according to claim 1, wherein each first region comprises a heavily doped central portion and lightly doped lateral portions.

12. The MOS-technology power device integrated structure according to claim 1, wherein said plurality of first regions, said plurality of second regions are heavily doped.

13. The MOS-technology power device integrated structure according to claim 1, wherein said semiconductor layer is lightly doped.

14. The MOS-technology power device integrated structure according to claim 1, wherein said semiconductor layer lies over a heavily doped semiconductor substrate.

15. The MOS-technology power device integrated structure according to claim 14, wherein said semiconductor substrate is of the second conductivity type.

16. The MOS-technology power device integrated structure according to claim 14, wherein said semiconductor substrate is of the first conductivity type.

17. The MOS-technology power device integrated structure according to claim 1, wherein said first and second conductivity types are P and N types, respectively.

18. The MOS-technology power device integrated structure according to claim 1, wherein said first and second conductivity types are N and P types, respectively.

19. A MOS-technology power device integrated structure comprising:
  a plurality of first regions of a first conductivity type formed in a semiconductor layer of a second conductivity type, each of said first regions including a source region of the second conductivity type;
  a frame region of the first conductivity type formed in the semiconductor layer, surrounding and merged with said first regions at each end of said first regions, the frame region having a doping level such that a depth of the frame region into the semiconductor layer is in a range from less than a depth of the plurality of first regions into the semiconductor layer to greater than the depth of the plurality of first regions into the semiconductor layer;
  a plurality of gate regions, each gate region being insulatively disposed over the semiconductor layer between adjacent first regions, and extending over a lateral portion of each adjacent first region;
  a plurality of gate metal fingers, each gate metal finger extending over and being electrically connected to at least a portion of a respective one of said gate regions; and
  a plurality of source metal fingers, each one extending over at least a portion of a respective first region and contacting the at least a portion of said first region and the respective source region within the at least a portion of the first region, so that the plurality of source metal fingers and the plurality of gate metal fingers are interdigitated.

20. The MOS-technology power device integrated structure according to claim 19, wherein the MOS-technology power device has a high Breakdown Voltage $BVd_{ss}$ and the doping level of the frame region is such that the depth of the frame region into the semiconductor layer is greater than the depth of the plurality of first regions.

21. The MOS-technology power device integrated structure according to claim 19, wherein the MOS-technology power device has a low to medium Breakdown Voltage $BVd_{ss}$ and the doping level of the frame region is such that the depth of the frame region into the semiconductor layer is less than the depth of the plurality of first regions.

22. The MOS-technology power device integrated structure according to claim 19, wherein said plurality of gate metal fingers are connected at one end to a gate metal frame surrounding the plurality of gate metal fingers, the gate metal frame being disposed above the frame region.

23. The MOS-technology power device integrated structure according to claim 19, wherein said source metal fingers extend outwardly from a source metal plate disposed above the semiconductor layer.

24. The MOS-technology power device integrated structure according to claim 19, further comprising a plurality of second regions of the first conductivity type, each second region being merged at each end with said frame region, each second region being located under a respective gate region so that the plurality of first regions are disposed in parallel with the plurality of second regions.

25. The MOS-technology power device integrated structure according to claim 24, further comprising a plurality of regions of the second conductivity type, each region of the second conductive type being disposed between a respective one of the first and the second regions.

26. The MOS-technology power device integrated structure according to claim 19, wherein each of the plurality of gate regions is insulatively disposed above the underlying semiconductor layer by an oxide layer.

27. The MOS-technology power device integrated structure according to claim 26, wherein said oxide layer has a uniform thickness.

28. The MOS-technology power device integrated structure according to claim 26, wherein said oxide layer comprises a thick oxide portion disposed under a portion of each gate region and disposed under the respective gate metal finger, and a thin oxide portion disposed under a remaining lateral portion of each gate region, the thin oxide portion extending over the lateral portion of each adjacent first region.

29. The MOS-technology power device integrated structure according to claim 19, wherein each said source region comprises two laterally displaced source regions disposed substantially in parallel within each first region.

30. The MOS-technology power device integrated structure according to claim 29, wherein said two laterally displaced source regions extend for an entire length of each respective first region in which they are included.

31. The MOS-technology power device integrated structure according to claim 19, wherein each first region is an elongated region having a length and each source region includes a plurality of source regions intercalated with portions of the respective first region along the length of the first region.

32. The MOS-technology power device integrated structure according to claim 19, wherein each first region comprises a heavily doped central portion and lightly doped lateral portions.

33. The MOS-technology power device integrated structure according to claim 24, wherein said plurality of first regions, said plurality of second regions and said frame region are heavily doped.

34. The MOS-technology power device integrated structure according to claim 19, wherein said semiconductor layer is lightly doped.

35. The MOS-technology power device integrated structure according to claim 19, wherein said semiconductor layer lies over a heavily doped semiconductor substrate.

36. The MOS-technology power device integrated structure according to claim 35, wherein said semiconductor substrate is of the second conductivity type.

37. The MOS-technology power device integrated structure according to claim 35, wherein said semiconductor substrate is of the first conductivity type.

38. The MOS-technology power device integrated structure according to claim 19, wherein said first and second conductivity types are P and N types, respectively.

39. The MOS-technology power device integrated structure according to claim 19, wherein said first and second conductivity types are N and P types, respectively.

40. A process for manufacturing a MOS-technology power device integrated structure, comprising the steps of:
   forming a plurality of first regions of a first conductivity type having a first doping level and a frame region of the first conductivity type in a lightly doped semiconductor layer of a second conductivity type having a second doping level, the frame region surrounding and being merged with the plurality of first regions at each end of each first region;
   forming a source region of the second conductivity type in each first region;
   forming a plurality of first gate regions, each first gate region being formed over the semiconductor layer between adjacent first regions and extending over a lateral portion of each adjacent first region;
   forming a plurality of second regions of the first conductivity type, each second region having its ends merged with said frame region, the plurality of second regions being disposed in parallel with the plurality of first regions;
   forming a plurality of gate metal fingers, each gate metal finger extending over and contacting a portion of a respective first gate region;
   forming a source metal plate and source metal fingers extending from the source metal plate above the semiconductor layer, each source metal finger extending over and contacting at least a portion of a respective first region and the source region formed therein such that the gate metal fingers and the source metal fingers are interdigitated; and
   forming a plurality of regions of the second conductivity type, each region of the second conductivity type being formed between a respective first region and a respective second region and having a third doping level such that a depth of the plurality of regions of the second conductivity type into the semiconductor layer is in a range from shallower than a depth of the source region in the plurality of first regions to a depth of the plurality of first regions in the semiconductor layer.

41. The process according to claim 40, wherein the plurality of regions of the second conductivity type are formed with the third doping level that is greater than the second doping level and that is less than or equal to the first doping level.

42. A process for manufacturing a MOS-technology power device integrated structure, comprising the steps of:
   forming a plurality of first regions of a first conductivity type and a frame region of the first conductivity type in a lightly doped semiconductor layer of a second conductivity type, the frame region being formed such that it is surrounding and merged with the plurality of first regions at each end of each first region and has a doping level such that a depth of the frame region into the semiconductor layer is in a range from less than a depth of the plurality of first regions into the semiconductor layer to greater than the depth of the plurality of first regions into the semiconductor layer;
   forming a source region of the second conductivity type in each first region;
   forming a plurality of first gate regions, each first gate region being formed over the semiconductor layer between adjacent first regions and extending over a lateral portion of each adjacent first region;
   forming a plurality of gate metal fingers, each gate metal finger extending over and contacting a portion of a respective first gate region; and
   forming a source metal plate and source metal fingers extending from the source metal plate above the semiconductor layer, each source metal finger extending over and contacting at least a portion of a respective first region and the source region formed therein such that the gate metal fingers and the source metal fingers are interdigitated.

43. The process according to claim 42, wherein the step of forming the plurality of first regions and the frame region includes forming the frame region with a doping level such that the depth of the frame region into the semiconductor layer is greater than the depth of the plurality of first regions.

44. The process according to claim 42, wherein the step of forming the plurality of first regions and the frame region includes forming the frame region with a doping level such that the depth of the frame region into the semiconductor layer is less than the depth of the plurality of first regions.

45. The process according to claim 42, further comprising the step of forming a plurality of second regions of the first conductivity type, each second region having its ends merged with said frame region, the plurality of second regions being disposed in parallel with the plurality of first regions.

46. The process according to claim 45, further comprising the step of forming a plurality of regions of the second conductivity type, each region of the second conductivity type being formed between a respective first region and a respective second region.

47. A process for manufacturing a MOS power device, comprising the steps of:
   a) forming an oxide layer over a lightly doped semiconductor layer of a second conductivity type having a second doping level;
   b) selectively removing the oxide layer to open windows in the oxide layer;
   c) implanting a plurality of doses of a first dopant of a first conductivity type into the lightly doped semiconductor layer through the windows in the oxide layer;
   d) diffusing the first dopant within the lightly doped semiconductor layer at a first doping level to form a plurality of first regions, a plurality of second regions that are disposed in parallel with the plurality of first regions, and a frame region surrounding and merged with ends of each of the plurality of first regions and the plurality of second regions and that has a depth into the semiconductor layer that is in a range from less than a depth of the plurality of first regions and the plurality of second regions to greater than a depth of the plurality of first regions and the plurality of second regions;

e) removing the oxide layer;

f) implanting a second dopant of the second conductivity type at a third doping level in the lightly doped semiconductor layer to form a plurality of regions of the second conductivity type, each region of the second conductivity type being formed between a first region and a second region, said second dopant being implanted in a dose suitable not to invert a conductivity type of the plurality of first regions, a conductivity type of the plurality of second regions and a conductivity type of the frame region and suitable so that a depth of the plurality of regions of the second conductivity type into the semiconductor layer is in a range from shallower than a depth of the at least one source region up to a depth of the plurality of first regions into the semiconductor layer;

g) forming a thin oxide layer over the lightly doped semiconductor layer;

h) forming a polysilicon layer over the thin oxide layer;

i) selectively removing the polysilicon layer and the thin oxide layer to define a plurality of first gate regions, each first gate region being formed over the semiconductor layer between adjacent first regions and extending over a lateral portion of the adjacent first regions;

j) implanting a low dose of a third dopant of the first conductivity type in each of the first regions to form lightly doped channel portions at the lateral portions of the first regions;

k) selectively implanting a heavy dose of a fourth dopant of the second conductivity type in the first regions to form the at least one source region;

l) forming a dielectric layer over the lightly doped semiconductor layer and the polysilicon layer;

m) selectively removing the dielectric layer to open contact windows respectively over the plurality of first regions and over the plurality of first gate regions;

n) forming a metal layer over the dielectric layer; and o) selectively removing the metal layer to form a source metal plate, source metal fingers extending over and contacting the first regions and the at least one source region within the first region, and gate metal fingers extending over and contacting at least a potion of each first gate region.

48. The process according to claim 47, wherein the plurality of regions of the second conductivity type are implanted at a third doping level that is greater than the second doping level and is less than or equal to the first doping level.

49. The Process according to claim 47, wherein step d) includes growing a thick oxide layer above the plurality of second regions, and step e) includes not removing the thick oxide layer over the plurality of second regions.

* * * * *